US008355263B2

(12) United States Patent
Myers et al.

(10) Patent No.: US 8,355,263 B2
(45) Date of Patent: Jan. 15, 2013

(54) INTERLOCKING EMI SHIELD

(75) Inventors: Scott Myers, San Francisco, CA (US); Erik Wang, Redwood City, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/101,933

(22) Filed: May 5, 2011

(65) Prior Publication Data

US 2011/0211327 A1 Sep. 1, 2011

Related U.S. Application Data

(63) Continuation of application No. 12/112,729, filed on Apr. 30, 2008, now Pat. No. 7,952,890.

(51) Int. Cl.
*H05K 9/00* (2006.01)
(52) U.S. Cl. .................... 361/816; 361/802; 361/818
(58) Field of Classification Search .................. 361/753, 361/816, 818, 799–802; 174/350, 377, 387, 174/357, 351, 372, 354, 72, 378
See application file for complete search history.

(56) References Cited

U.S. PATENT DOCUMENTS

| 3,721,746 | A | | 3/1973 | Knappenberger |
| 3,816,911 | A | | 6/1974 | Knappenberger |
| 5,633,786 | A | | 5/1997 | Matuszewski et al. |
| 5,844,784 | A | * | 12/1998 | Moran et al. ................. 361/818 |
| 5,895,884 | A | | 4/1999 | Davidson |
| 6,600,663 | B1 | | 7/2003 | Koleda |
| 6,679,707 | B1 | | 1/2004 | Brodsky et al. |
| 7,183,498 | B2 | * | 2/2007 | Ogura et al. ................. 174/387 |
| 7,534,968 | B2 | * | 5/2009 | English et al. ............... 174/382 |
| 7,663,895 | B2 | * | 2/2010 | Huang ........................ 361/818 |
| 7,682,160 | B2 | | 3/2010 | Liao |
| 8,031,485 | B2 | * | 10/2011 | Bogursky et al. ............ 361/816 |
| 2003/0169583 | A1 | | 9/2003 | Watanabe |
| 2005/0231932 | A1 | | 10/2005 | Nestor et al. |
| 2009/0097223 | A1 | | 4/2009 | Huang |
| 2010/0149780 | A1 | | 6/2010 | Ren et al. |

FOREIGN PATENT DOCUMENTS

| CN | 1466414 | 1/2004 |
| CN | 2696083 | 4/2005 |
| DE | 19633354 | 2/1997 |
| EP | 1061789 | 12/2000 |

* cited by examiner

*Primary Examiner* — Hung S Bui
(74) *Attorney, Agent, or Firm* — Womble Carlyle Sandridge & Rice LLP (57) ABSTRACT

An electromagnetic interference shield system, is provided. Each EMI shield may include a frame providing the structure around the electronic device components to be shielded, and a cover operative to be placed over the frame to prevent electromagnetic radiation from passing over the frame. Each frame may be coupled to a circuit board, and enclose electronic components in need of shielding. Each cover may be coupled to its corresponding frame using at least one snap that extends from the periphery of the cover towards the frame and circuit board. To minimize the space taken by the EMI shields, the snaps of adjacent covers may be offset or staggered so that opposing snaps engage voids left between snaps of the opposing cover, thus reducing the space needed between adjacent EMI shields by up to the width of a snap.

18 Claims, 8 Drawing Sheets

INTERLOCKING EMI SHIELD

CROSS-REFERENCE TO RELATED APPLICATIONS

This application is a continuation of U.S. patent application Ser. No. 12/112,729, filed Apr. 30, 2008, which is hereby incorporated by reference herein in its entirety.

BACKGROUND OF THE INVENTION

This invention is directed to an interlocking electromagnetic interference (EMI) shield system for use in an electronic device.

Many electronic devices include various electronic components that emit electromagnetic radiation. To prevent disturbances of the electronic components, EMI shields may be provided in the electronic device. For example, the electronic device components may be placed in a conductive box (e.g., a metallic box) that prevents radiation from escaping the box. As another example, the enclosure in which the electronic components are placed may be coated with a metallic or conductive paint.

Although these solutions for reducing electromagnetic interferences may be effective, they may take up significant space, especially in view of the size of particular electronic components. For example, a lot of space is used to surround a small electrical circuit on all sides with a metallic box. When several electronic components of an electronic device need to be individually shielded, even more space is used to surround each component with individual conductive boxes. There is a need, therefore, for an EMI shielding system that takes up little space while providing sufficient and effective EMI shielding.

SUMMARY OF THE INVENTION

An interlocking EMI shield system for protecting components of an electronic device from electromagnetic interferences is provided.

An interlocking EMI shield is provided. Each EMI shield may be constructed from a frame that is coupled to a circuit board or other electronic device structural component, and a cover that is placed over the frame. The frame may be coupled to the circuit board using any suitable approach, including for example soldering, a mechanical fastener, an adhesive, or a snapping mechanism. The frame may include walls extending around the periphery the shield, and a lip extending from the top edge of the walls towards the center of the shield (e.g., to provide additional structural support). The walls may include one or more snaps, tabs, apertures or indentations for receiving a corresponding element from the cover.

Each cover may include a substantially flat surface operative to be placed over the frame. To couple the cover to the frame, the cover may include several snaps extending vertically from the cover surface towards the circuit board to which the frame is coupled. The snaps may be biased towards the walls of the frame such that the snaps are operative to engage the walls upon coupling of the cover to the frame. In some embodiments, the snaps may include, one or more tabs, prongs, or other elements to engage a counterpoint in the wall of the frame.

Each cover may include any suitable number of snaps. For example, each cover may include several snaps, each separated by a particular distance (e.g., at least by the width of a snap). The snaps may have the same or different sizes, and be distributed evenly or unevenly along the periphery of the cover. To reduce the space taken by the shields, the snaps of shields placed adjacent in the electronic device (e.g., having edges placed almost in contact) may be offset or staggered such that a snap of a first EMI shield may extend into an indentation of the second EMI shield (e.g., in between two snaps extending from the second EMI shield), while a snap of the second EMI shield may extend into an indentation of the first EMI shield (e.g., in between two snaps extending from the first EMI shield). Using this staggered approach, space of at least the thickness of one snap may be, saved for other components of the electronic device, or to further reduce the size of the electronic device.

BRIEF DESCRIPTION OF THE DRAWINGS

The above and other features of the present invention, its nature and various advantages will be more apparent upon consideration of the following detailed description, taken in conjunction with the accompanying drawings in which.

DETAILED DESCRIPTION

Figure 1:
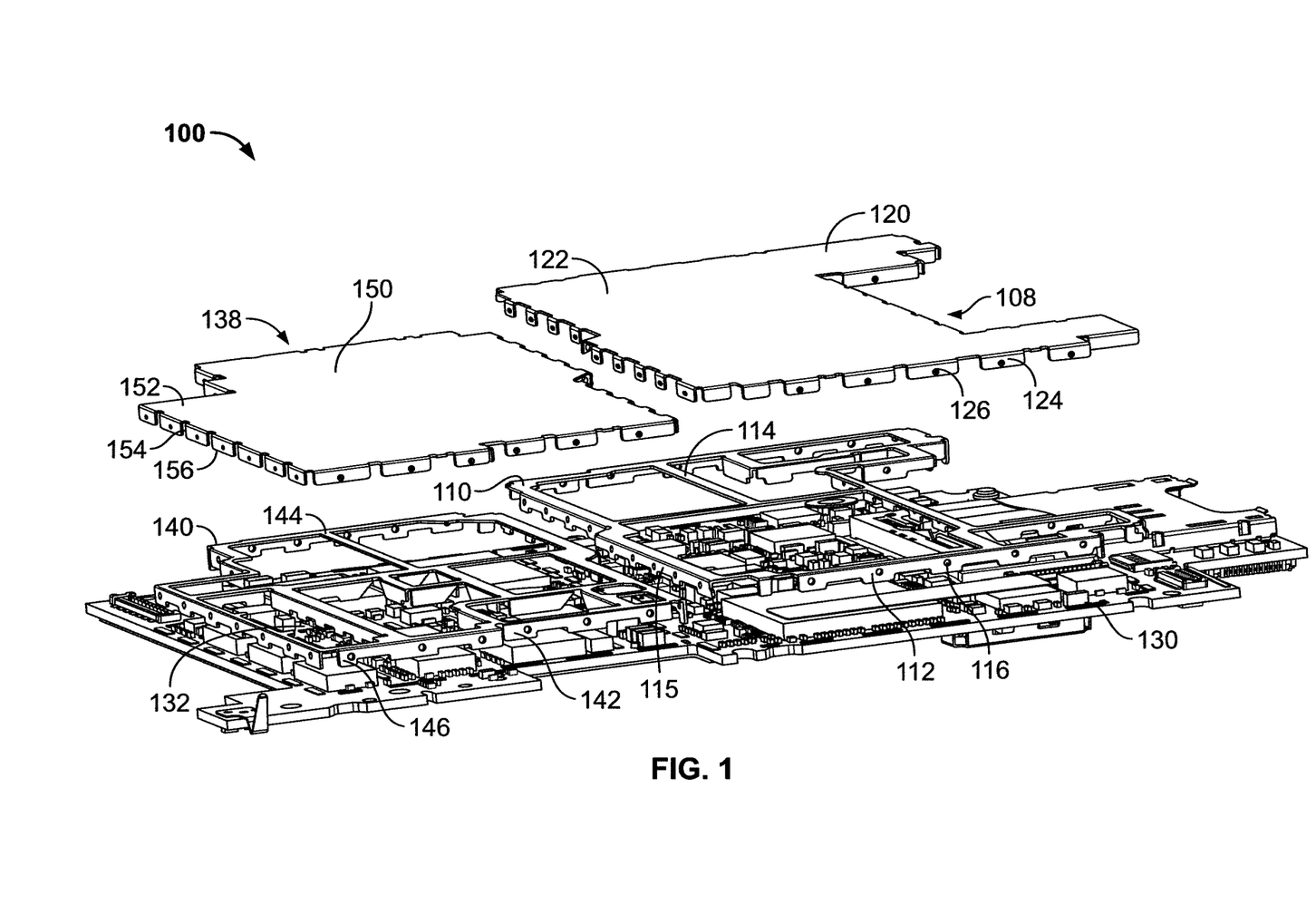
FIG. 1 is an exploded perspective view of an illustrative EMI shield in accordance with one embodiment of the invention.

FIG. 1 is an exploded perspective view of an illustrative EMI shield assembly in accordance with one embodiment of the invention. EMI shield assembly 100 may be formed from first EMI shield 108 that includes frame 110 and cover 120, and second EMI shield 138 that includes frame 140 and cover 150. Each of frames 110 and 140 may include side walls 112 and 142, and upper lip or returns 114 and 144, respectively. Side wells 112 and 142 may be operative to be coupled to circuit board 130 of an electronic device to form the side walls of box, for example surrounding electronic components. Side walls 112 and 142 may be coupled to circuit board 130 using any suitable approach. For example, side walls 112 and 142 may be soldered into circuit board 130, snapped or clipped into a structural element of circuit board 130 (e.g., snaps extending in apertures in the circuit board, or snaps coupling to a receiving element incorporated in the circuit board), coupled using an adhesive or tape, or using any other suitable approach. In some embodiments, frames 110 and 140 may be combined into a single frame having a separating wall (e.g., along boundary 115) onto which distinct covers 120 and 150 may be attached.

Frames 110 and 140 may be placed on any suitable portion of circuit board 130. For example, frames 110 and 140 may be placed to surround specific electronic device components 132 incorporated in circuit board 130. In particular, frames 110 and 140 may be placed around different components 132 that emit electromagnetic radiation, or that are susceptible to electromagnetic radiation. If circuit board 130 includes two different components 132, both emitting electromagnetic radiation, and both susceptible to each other's emissions, each may be surrounded by one of frames 110 and 140 to prevent or reduce electromagnetic interferences to the operation of components 132. In addition, using two separate EMI shields 108 and 138 with separate covers 120 and 150 that can be individually removed may allow for access to particular components 132 (e.g., for repair) without disturbing other components that may be sensitive to interferences from the exposed components.

To prevent radiation from escaping over the end of side wall 112 and 142, respectively, covers 120 and 150 may be placed over frames 110 and 140, respectively. Once the covers are placed over the frames, components 132 are enclosed in all directions by the cover, side walls and circuit board, thus preventing interfering radiation from escaping and damaging other components 132. Covers 120 and 150 may include a substantially flat surface 122 and 152 operative to be placed over each of frames 110 and 140. Covers 120 and 150 may have any suitable boundaries, including for example boundaries that substantially follow side walls 112 and 142, respectively. By providing covers that do not extend past, or minimally extend past side walls 110 and 140, the space required in the electronic device for covers 120 and 150 may be minimized.

Covers 120 and 150 may be coupled to frames 110 and 140 using any suitable approach. In some embodiments, covers 120 and 150 may include snaps 124 and 154 extending from flat surfaces 122 and 152. For example, snaps 124 and 154 may extend orthogonally (e.g., vertically) from surfaces 122, and be located at the periphery of surfaces 122 and 154. By being located at the periphery, snaps 124 and 154 may be substantially aligned with side walls 112 and 142, respectively, such that the snaps may engage a portion of the side walls. Snaps 124 and 154 may include one or more mechanisms for engaging side walls 112 and 142. For example, snaps 124 and 154 may be elastically biased towards side walls 112 and 142 such that snaps 124 and 154 may deflect when they are placed over frames 110 and 140, respectively, thus creating an interference or frictional fit. As another example, snaps 124 and 154 may include a tab or protrusion 126 and 156; respectively, operative to engage a corresponding indentation or tab 116 and 146, respectively, in the side wall. As still another example, a tape, adhesive or mechanical fastener (e.g., a screw passing through snaps 124 and 154 and engaging side walls 112 and 142, respectively) may be used to secure snaps 124 and 154 to frames 110 and 140, respectively.

Each cover 120 and 150 may include any suitable number of snaps 124 and 154. For example, a cover may include snaps 124 and 154 offset at distances larger than the width of a snap. In some embodiments, different snaps 124 and 154 may have different sizes, for example based on the component 132 lying adjacent the snap on circuit board 130, or based on the position of snap relative frame 310 or 140 (e.g., a snap adjacent a corner may be wider than a snap in the middle of a wall). The snaps may also be distributed along the periphery of the cover using any suitable approach, including for example evenly, or based on the EMI shielding or structural requirements of the shield.

Frames 110 and 140, and covers 120 and 150 may be manufactured from any suitable material operative to shield the components of contained within EMI shield 100 from electro-magnetic interference (e.g., from other components of the electronic device). In some embodiments, shield 100 may be constructed from an electrically conductive material such as, for example, metal (e.g., copper silver, aluminum, steel), graphite, plasma, or any other conductive material. Frames 110 and 140, and covers 120 and 150 may include unbroken surfaces, or materials with a mesh or holes (e.g., so long as the holes are smaller than the wavelength of the radiation being kept out).

Figure 2:
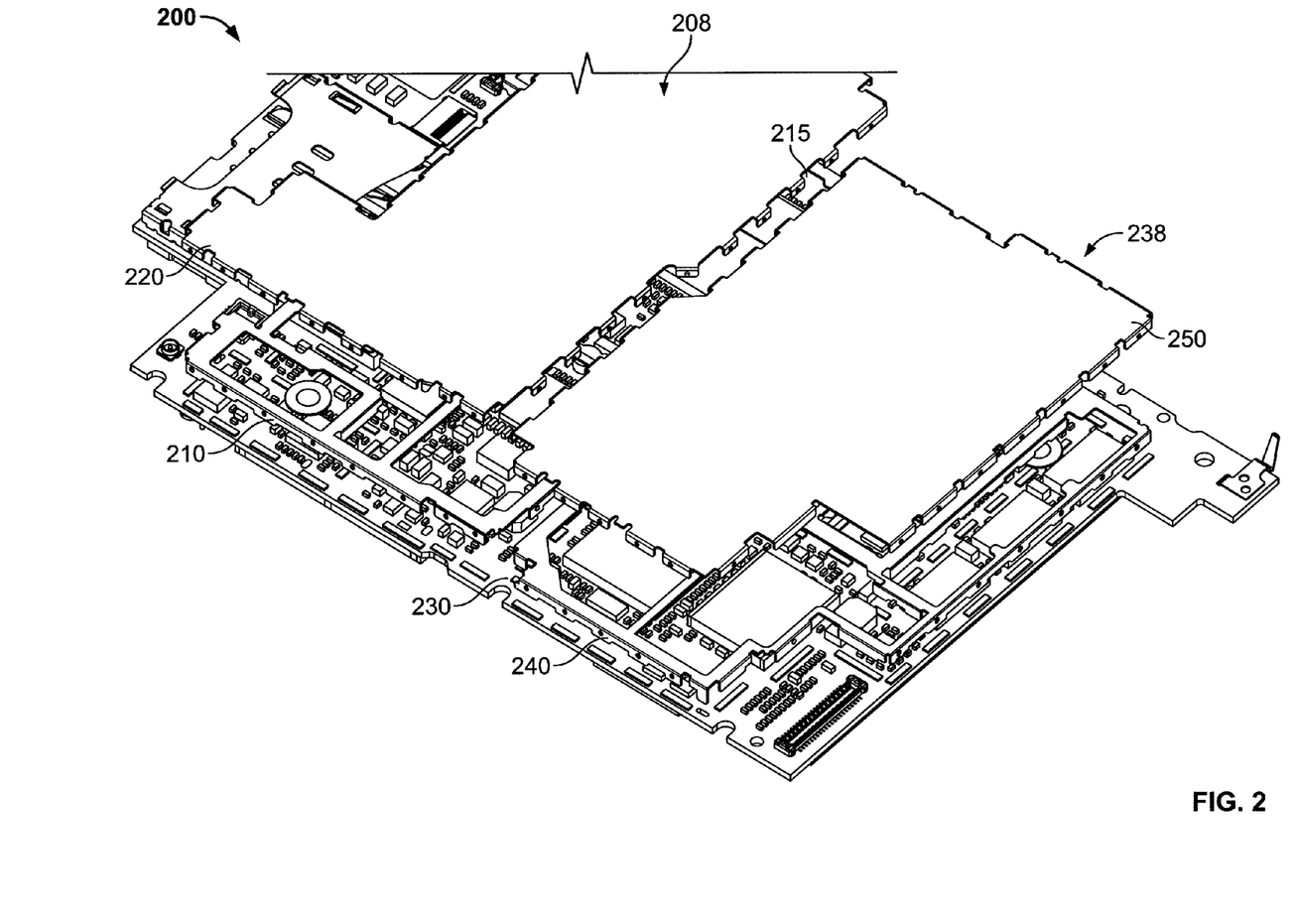
FIG. 2 is a top perspective view of an exploded EMI shield assembly in accordance with one embodiment of the invention.

Because two frames 110 and 140, and two covers 120 and 150 may be used in the same electronic device, space may be lost between each EMI shield (e.g., along boundary 115). To reduce the space required between adjacent EMI shields 108 and 138, shields 108 and 138 may interlock along boundary 115. FIG. 2 is a top perspective view of an exploded EMI shield assembly in accordance with one embodiment of the invention. EMI shield 208 and 238 may include some or all of the features of EMI shields 108 and 138 (FIG. 1) described above. Frames 210 and 240 may be coupled to circuit board 130 using any suitable approach. Covers 220 and 250 may then be placed over frames 210 and 240, respectively, such that the electronic device components within the boundary of each frame 210 and 240 are fully enclosed.

Using some approaches, EMI shields 208 and 238 may be placed adjacent, and brought together until covers 220 and 250, which form the external-most layer of the EMI shields (e.g., because tabs extending from the covers are positioned outside the side walls of the frames), are in near contact (e.g., along boundary 215). To save even more space, however, covers 220 and 250 may be designed to interlock.

Figure 3:
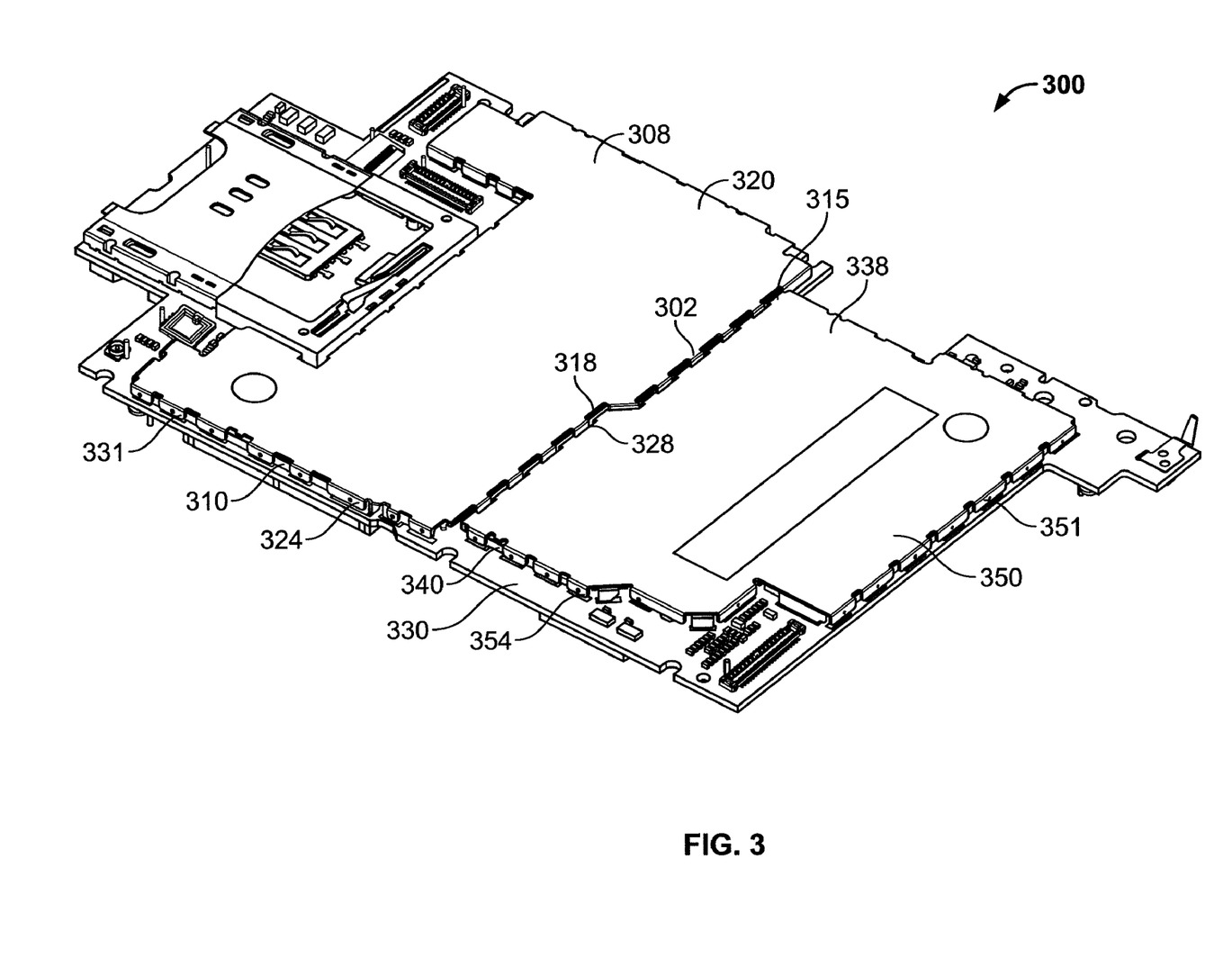
FIG. 3 is a perspective view of an EMI shield assembly coupled to a circuit board in accordance with one embodiment of the invention.

FIG. 3 is a perspective view of an assembled EMI shield assembly in accordance with one embodiment of the invention. EMI shield assembly 300 may include first EMI shield 308 and second EMI shield 338 that are coupled to circuit board 330. EMI shields 308 and 338 may include some or all of the features of any of the EMI shields described above in connection with FIGS. 1 and 2. First EMI shield 308 may include frame 310 to which cover 320 may be coupled, and second EMI shield 338 may include frame 340 to, which cover 350 may be coupled. Covers 320 and 350 may include snaps 324 and 354, respectively, for engaging frames 310 and 340, respectively. To save space between EMI shields 308 and 338 along boundary 315, snaps 324 and 354 of covers 320 and 350, respectively, may be arranged such that snaps 324 and 354 may interlock.

Figure 4:
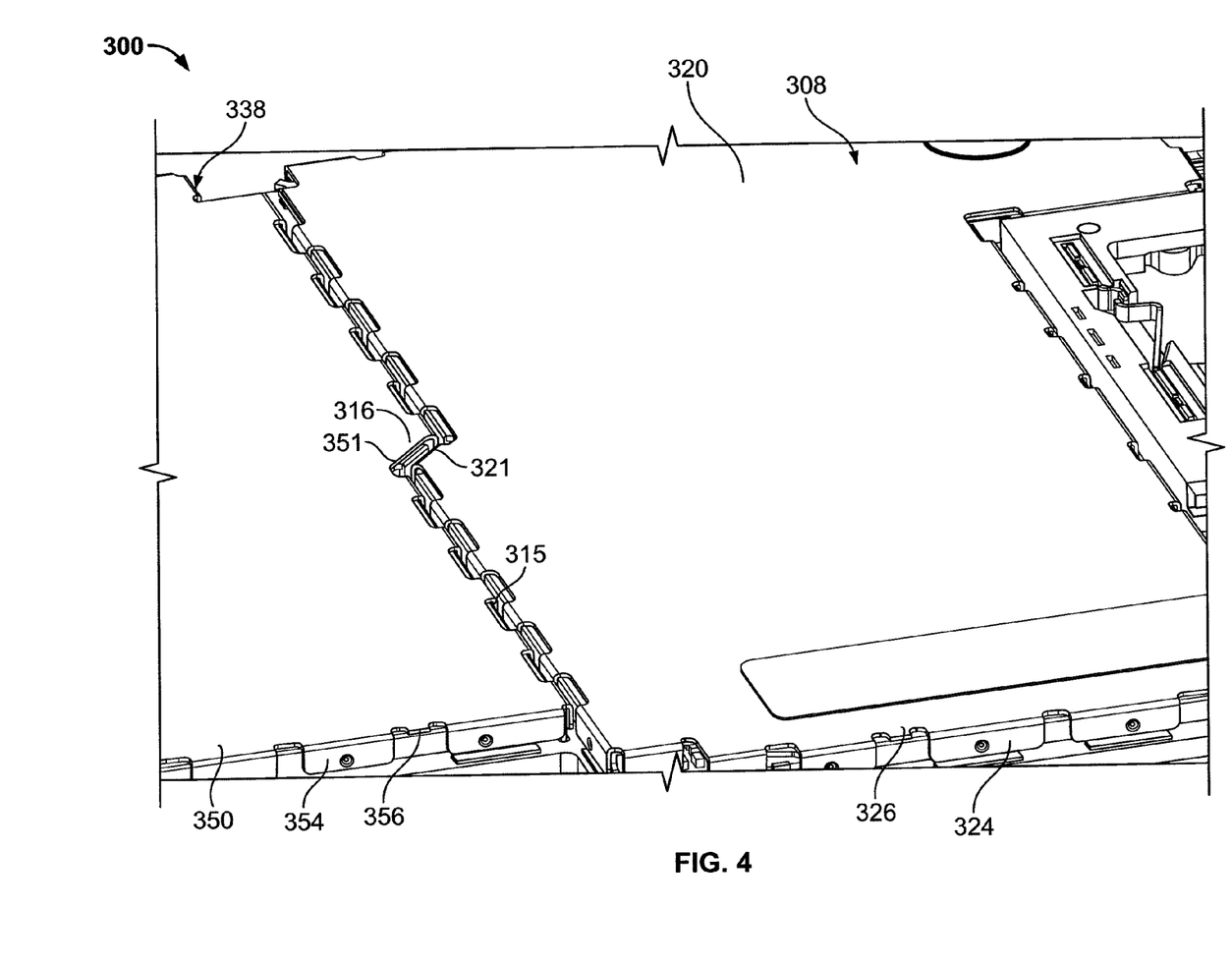
FIG. 4 is a perspective view of a detail of the EMI shield assembly of FIG. 3 along the boundary between the EMI shields in accordance with one embodiment of the invention.
Figure 5:
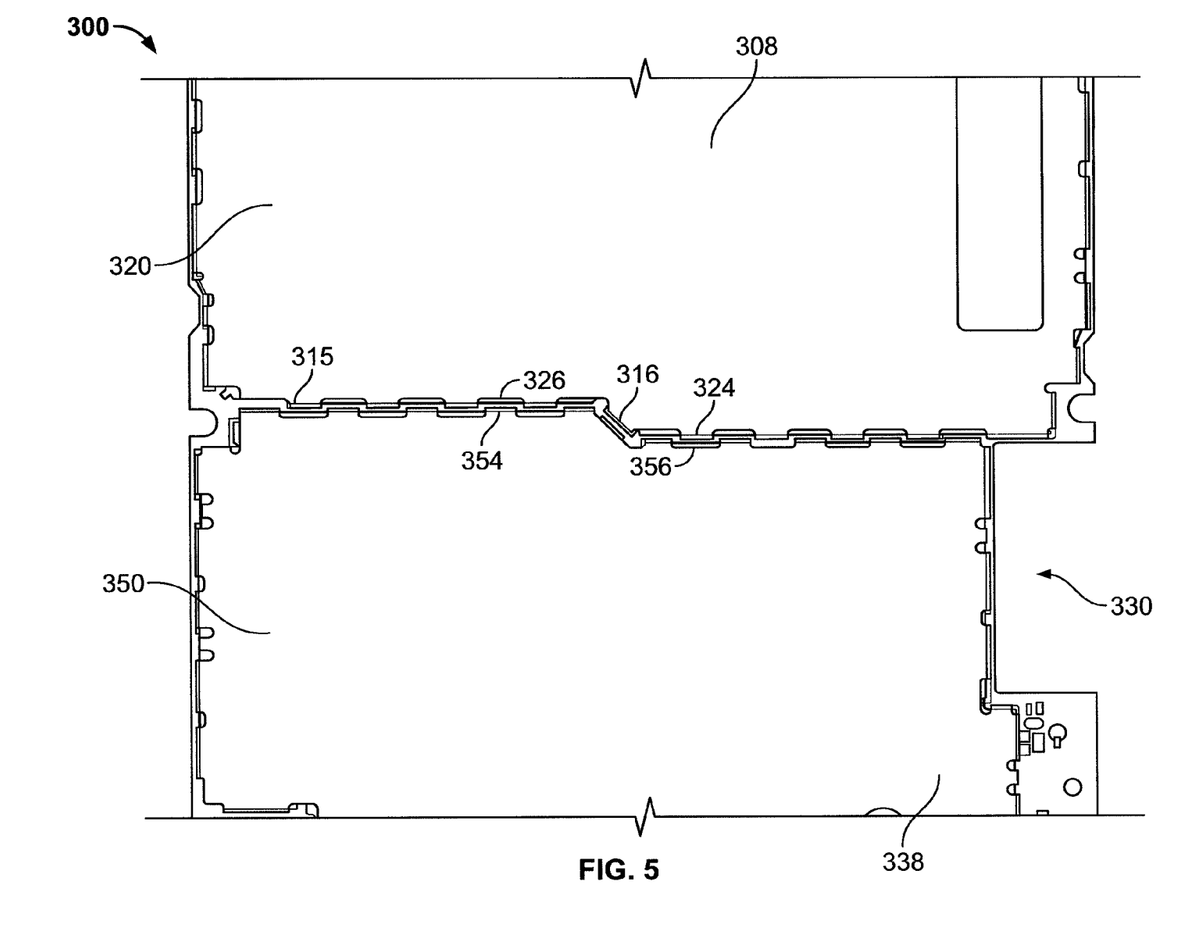
FIG. 5 is a top view of a detail of the EMI shield assembly of FIG. 3 along the boundary between the EMI shields in accordance with one embodiment of the invention.
Figure 6A:
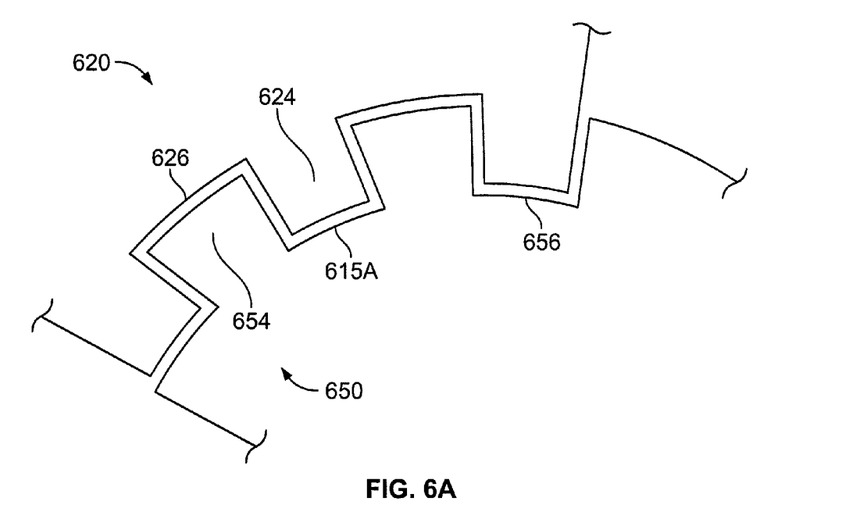
FIGS. 6A-6D are top views of a detail of an EMI shield assembly along the boundary between EMI shields in accordance with one embodiment of the invention.
Figure 6B:
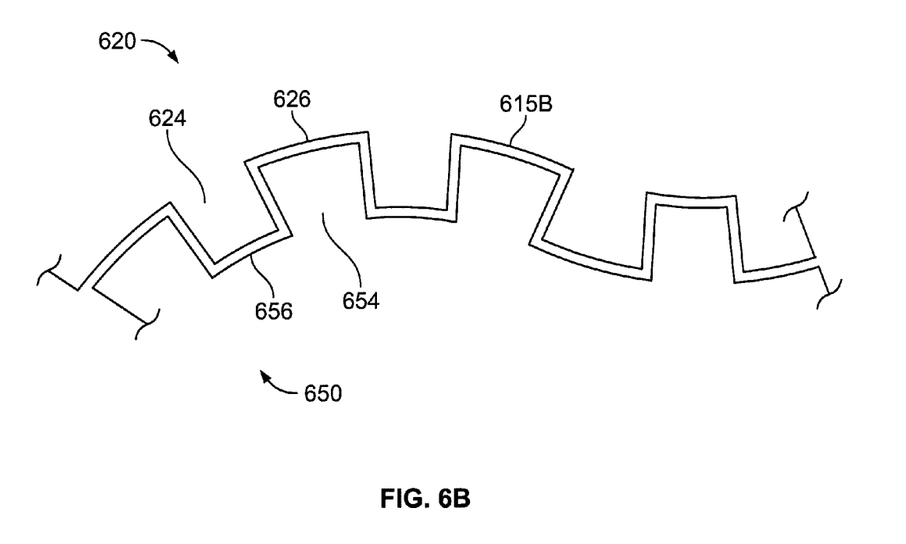
Figure 6C:
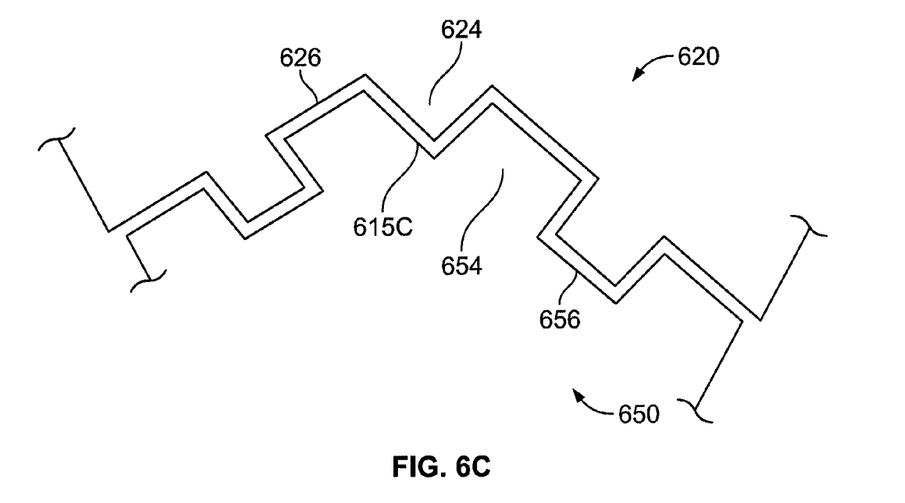
Figure 6D:
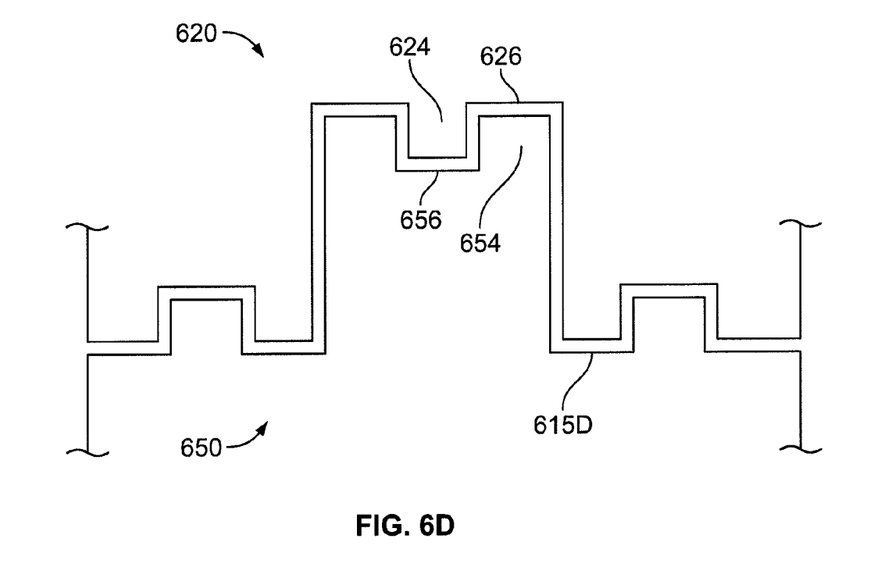

FIG. 4 is a perspective view of a detail of the EMI shield assembly of FIG. 3 along the boundary between the EMI shields in accordance with one embodiment of the invention. FIG. 5 is a top view of a detail of the EMI shield assembly of FIG. 3 along the boundary between the EMI shields in accordance with one embodiment of the invention. By the manner in which snaps 324 and 354 are constructed, snaps 324 and 354 extend beyond the respective peripheries 321 and 351 of covers 320 and 350, creating respective voids 326 and 356 between adjacent snaps 324 and 354, respectively. Voids 326 and 356 may be defined, for example, by the side wall of the underlying frame, and by the width of adjacent snaps 324 or 354.

By sizing and distributing snaps 324 and 354 and voids 326 and 356 judiciously, a snap 324 may extend into a void 356, and a corresponding snap 354 may extend into a void 324 along boundary 315 (e.g., where covers 320 and 350 engage). In addition, if snaps 324 and 354 have the same width (e.g., which would likely be the case if the same material is used for both covers 320 and 350), the depth of each void 326 and 356 would match the width of each snap 324, and 356 operative to engage or extend into the void. Thus, the space required between adjacent covers 320 and 350 may be reduced from the width of snap 324, plus the width of snap 354, plus a clearance factor to only the width of one of snaps 324 and 354, plus a clearance factor. This allows the space between adjacent EMI shields 308 and 338 to be reduced up to by half (e.g., by the thickness of the material, for example sheet metal plus any additional distance required to clear the snaps). For example, if the width of each snap 224 or 254 is in the range of 0.12 to 0.2 mm, the savings may be for example 0.15 mm.

Using this approach, in a top view, it may appear as though the snaps of both covers form a single layer placed between the frames of the two EMI shields (e.g., snaps of adjacent shields are substantially or at least partially aligned). For example, a single plane may include the inner surface of snap 324 and the outer surface of an adjacent snap 354.

In some embodiments, covers 320 and 350 may have different heights. For example, cover 320 may be higher than cover 350 (e.g., when coupled to frame 310). To allow covers 320 and 350 to engage, snaps 324 and 354 may be offset in the vertical dimension (e.g., along the height of covers 320 and 350). For example, snaps 324 may be located above snaps 354 when covers 320 and 350 engage because cover 320 is located above cover 350. Thus, the void used to place snap 354 near frame 310 may not be adjacent snap 324 (e.g., at a different point on the periphery of cover 320), but rather underneath a snap 324 (e.g., between the bottom edge of snap 324 and circuit board 330).

Any suitable approach may be used to ensure that adjacent covers 320 and 350 engage properly. For example, covers 320 and 350 may be shaped such that only one possible engagement of covers 320 and 350 is possible. As shown clearly in FIGS. 3-5, boundary 315 includes angled segment 316. Each of covers 320 and 350 may include corresponding angled portions 321 and 351, respectively. The size and shape of angled portions 321 and 351 may render any engagement of covers 320 and 350 that does not engage angled portions 321 and 351 impossible (e.g., covers 320 and 350 cannot engage properly, and save space unless angled segment 316 is properly created). This may ensure that covers 320 and 350 are properly placed on their respective frames, and that EMI shields 308 and 338 are properly mounted.

Other suitable shapes may be used instead of or in addition to angled segment 316. FIGS. 6A-6D are top views of a detail of an EMI shield assembly along the boundary between EMI shields in accordance with one embodiment of the invention. EMI shields 608 and 638 may include covers 620 and 650, respectively. Cover 620 may include tabs 624 and voids 626, and cover 650 may include tabs 654 and voids 656. Boundary 615 between EMI shields 608 and 638 may have any suitable, non-linear shape that allows only one reasonable engagement configuration. For example, boundary 615A includes a curved shape, boundary 615B includes several curved shapes, boundary 615C includes a single angle, and boundary 615D includes a protrusion. Tabs from each cover 620 and 650 may engage along any suitable surface, including several surfaces if boundary 615 includes several surfaces (e.g., boundary 615C includes engaging tabs along two surfaces of covers 620 and 650). It will be understood, however, that any other suitable shape may be used for boundary 615.

Figure 7:
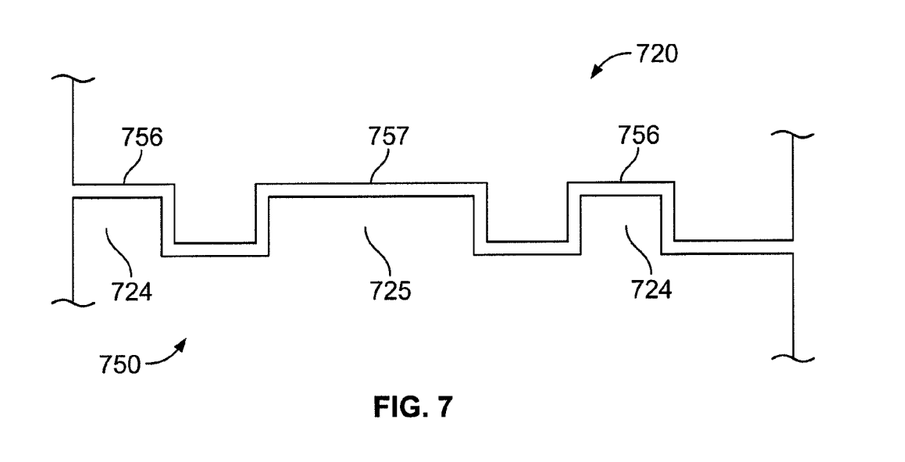
FIG. 7 is a top view of a detail of an EMI shield assembly along the boundary between EMI shields in accordance with one embodiment of the invention.

As another example, snaps 324 and 354, and corresponding voids 326 and 356 may be distributed along the periphery of each cover 320 and 350 such that, along the periphery that forms boundary 315, at least one snap and void in each cover is sized or located such that only one possible engagement of the covers is possible. FIG. 7 is a top view of a detail of an EMI shield assembly along the boundary between EMI shields in accordance with one embodiment of the invention. EMI shields 708 and 738 may include covers 720 and 750, respectively. Cover 720 may include first tabs 724, and second tab 725 that is different from first tabs 724. Conversely, cover 750 may include first voids 756 that is different from second void 757. When covers 720 and 750 are placed adjacent and engaged, the sizes of tabs 724 and 725, and of voids 756 and 757 may be such that the only possible engagement of covers 720 and 750 is with tab 724 engaging void 756, and tab 725 engaging void 757.

In some embodiments, more than two adjacent EMI shields installed on a circuit board may include tabs operative to engage to save space. For example, a two-dimensional array of interlocking EMI shields may be provided, such that different sides of a particular EMI shield may engage sides of different EMI shields (e.g., every side of the center EMI shield of a 3×3 array may engage another EMI shield). This may allow more components to be individually shielded while limiting the amount of space required for each shield.

The above described embodiments of the present invention are presented for purposes of illustration and not of limitation, and the present invention is limited only by the claims which follow.

What is claimed is:

1. An electromagnetic interference shield for use in an electronic device, comprising:
    a frame coupled to a circuit board of the electronic device, the frame comprising a wall extending substantially perpendicular to the circuit board; and
    a cover comprising a plurality of staggered snaps operative to engage the wall, the plurality of staggered snaps spaced to receive a snap from a cover of an adjacent electromagnetic shield between two adjacent snaps of the plurality of staggered snaps,
    wherein a distance between the frame and an adjacent frame is less than twice the thickness of one snap of the plurality of staggered snaps.

2. The electromagnetic interference shield of claim 1, wherein:
    the frame comprises an asymmetrical feature permitting a single orientation of the cover relative to the frame.

3. The electromagnetic interference shield of claim 2, wherein:
    the asymmetrical feature comprises an angle in the wall.

4. The electromagnetic interference shield of claim 1, wherein the frame is coupled to the board using at least one of:
    soldering;
    an adhesive;
    an engagement member; and a mechanical fastener.

5. The electromagnetic interference shield of claim 1, wherein:
    the wall comprises an indentation operative to engage at least one snap of the plurality of staggered snaps.

6. An electromagnetic interference shield, comprising:
    a first cover placed over first electrical components, wherein the first cover comprises a first snap extending from a periphery of the first cover; and
    a second cover placed over second electrical components, the second cover comprising a second snap extending from a periphery of the second cover, wherein the distance between the periphery of the first cover and the periphery of the second cover is less than the sum of the thickness of the first snap and the thickness of the second snap.

7. The electromagnetic interference shield of claim 6, wherein:
    the first cover comprises a plurality of staggered first snaps; and the second cover comprises a plurality of staggered second snaps.

8. The electromagnetic interference shield of claim 7, wherein a portion of the plurality of the staggered first snaps are placed between a portion of the plurality of the staggered second snaps.

9. The electromagnetic interference shield of claim 6, wherein:
the first cover comprises a planar cover surface from which the first snap extends.

10. The electromagnetic interference shield of claim 9, wherein:
the first snap extends substantially perpendicular to the planar cover surface.

11. The electromagnetic interference shield of claim 6, wherein:
the first cover and the second cover are constructed from conductive materials.

12. The electromagnetic interference shield of claim 6, further comprising:
a first frame engaged by the first snap of the first cover.

13. The electromagnetic interference shield of claim 12, further comprising:
a second frame engaged by the second snap of the second cover.

14. The electromagnetic interference shield of claim 13, wherein:
the distance between the first frame and the second frame is less than the sum of the thickness of the first snap and the thickness of the second snap.

15. A method for assembling an electromagnetic shield array, comprising:
coupling a first frame to a circuit board;
coupling a second frame to the circuit board;
placing a first cover over the first frame, wherein the first cover comprises at least two snaps operative to engage a portion of the first frame; and
placing a second cover over the second frame,
wherein:
the second cover comprises at least one snap operative to engage a portion of the second frame;
the at least one snap of the second cover is positioned between the at least two snaps of the first cover; and
the at least two snaps of the first cover and the at least one snap of the second cover are in a same plane.

16. The method of claim 15, further comprising:
soldering the first frame to the circuit board; and
soldering the second frame to the circuit board.

17. The method of claim 15, further comprising:
interlocking the at least two snaps of the first cover and the at least one snap of the second cover.

18. The method of claim 17, further comprising:
maintaining the first cover not in contact with the second cover.

* * * * *